(12) United States Patent
Morinaga et al.

(10) Patent No.: US 6,498,132 B2
(45) Date of Patent: *Dec. 24, 2002

(54) METHOD FOR TREATING SURFACE OF SUBSTRATE AND SURFACE TREATMENT COMPOSITION USED FOR THE SAME

(75) Inventors: Hitoshi Morinaga, Fukuoka (JP); Masaya Fujisue, Fukuoka (JP)

(73) Assignee: Mitsubishi Chemical Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/749,545

(22) Filed: Dec. 28, 2000

(65) Prior Publication Data

US 2002/0045556 A1 Apr. 18, 2002

Related U.S. Application Data

(62) Division of application No. 09/218,000, filed on Dec. 22, 1998, now Pat. No. 6,228,823, which is a division of application No. 08/809,147, filed as application No. PCT/JP96/02077 on Jul. 25, 1996, now Pat. No. 5,885,362.

(30) Foreign Application Priority Data

| Jul. 27, 1995 | (JP) | 7-191504 |
| Aug. 17, 1995 | (JP) | 7-230700 |
| Aug. 30, 1995 | (JP) | 7-243859 |
| Sep. 11, 1995 | (JP) | 7-257237 |
| Sep. 11, 1995 | (JP) | 7-257238 |
| Oct. 4, 1995 | (JP) | 7-279912 |
| Oct. 4, 1995 | (JP) | 7-279913 |
| Mar. 13, 1996 | (JP) | 8-56087 |

(51) Int. Cl.$^7$ .............................. C11D 3/30; C11D 7/18
(52) U.S. Cl. .................. 510/175; 510/178; 510/181; 510/202; 510/254; 510/405; 510/480; 510/499; 134/2; 134/3
(58) Field of Search ................ 510/175, 178, 510/181, 202, 254, 405, 480, 499; 134/2, 3

(56) References Cited

U.S. PATENT DOCUMENTS

| 3,796,667 | A |   | 3/1974 | Block et al. |
| 3,895,913 | A |   | 7/1975 | Bockowski et al. |
| 4,003,975 | A |   | 1/1977 | Tancredi et al. |
| 4,130,582 | A |   | 12/1978 | Petree et al. |
| 4,383,043 | A |   | 5/1983 | Denney et al. |
| 4,717,459 | A |   | 1/1988 | Nakazawa et al. |
| 4,778,655 | A |   | 10/1988 | Greaves |
| 4,929,301 | A | * | 5/1990 | Beechko ................ 156/657 |
| 5,364,549 | A | * | 11/1994 | McDonogh ............ 252/79.4 |
| 5,498,511 | A |   | 3/1996 | Yamashita et al. |
| 5,712,168 | A |   | 1/1998 | Schmidt et al. |
| 5,853,491 | A |   | 12/1998 | Schulz |
| 6,228,823 | B1 | * | 5/2001 | Morinaga et al. ....... 510/175 |

FOREIGN PATENT DOCUMENTS

| EP | 0 331 556 | 9/1989 |
| JP | 55-52397 | 4/1980 |
| JP | 56-149499 | 11/1981 |
| JP | 64-20295 | 1/1989 |
| JP | 5-275405 | 10/1993 |
| JP | 6-41773 | 2/1994 |
| JP | 6-163495 | 6/1994 |
| JP | 6-216098 | 8/1994 |

* cited by examiner

*Primary Examiner*—Charles Boyer
(74) *Attorney, Agent, or Firm*—Oblon, Spivak, McClelland, Maier & Neustadt, P.C.

(57) ABSTRACT

A method for treating the surface of a substrate with a surface treatment composition, wherein the surface treatment composition comprises a liquid medium containing a complexing agent as a metal deposition preventive, the complexing agent comprising at least one member selected from Group A complexing agents and at least one member selected from Group B complexing agents as defined hereinafter.

10 Claims, No Drawings

METHOD FOR TREATING SURFACE OF SUBSTRATE AND SURFACE TREATMENT COMPOSITION USED FOR THE SAME

This application is a Division of application Ser. No. 09/218,000 filed on Dec. 22, 1998 U.S. Pat. No. 6,228,823, which is a Divisional application of Ser. No. 08/809,147, filed May 14, 1997, which is now U.S. Pat. No. 5,885,362 which was originally filed as PCT/JP96/02077, filed on Jul. 25, 1996.

TECHNICAL FIELD

The present invention relates to a surface treatment composition and a method for treating the surface of a substrate using the same. More particularly, the present invention relates to a surface treatment composition comprising a liquid medium as the main component, which prevents a substrate surface from being contaminated with metal impurities from the surface treatment composition and stably provides an extremely clean substrate surface, and also relates to a method for treating the surface of a substrate by using the same. Further, the present invention relates to a method for supplying components for the surface treatment composition and a method for purifying a complexing agent used for the composition.

BACKGROUND ART

In accordance with high integration of various devices represented by VLSI, TFT liquid crystals and the like, cleanliness levels of substrate surfaces used for these devices are demanded to be higher and higher. Contaminations with various materials disturb to achieve higher cleanliness, and among the contaminations, a metallic contamination particularly deteriorates electric properties of a device, and it is therefore necessary to utmostly lower a metal impurity concentration on a substrate surface for forming a device in order to prevent the above-mentioned deterioration. For this purpose, it is generally conducted to clean a substrate surface with a cleaning agent.

Heretofore, for this type cleaning agent, there are generally used water, electrolyzed ionic water, acid, alkali, oxidizing agent, surfactant aqueous solution or organic solvents and the like. The cleaning agent is demanded not only to have excellent cleaning performances but also to have an impurity concentration of such an extremely low level as to prevent a substrate from being contaminated with a metal impurity from the cleaning agent. In order to satisfy these demands, cleaning chemicals for semiconductors are highly purified, and a metal impurity concentration in the chemicals immediately after purification reaches a level of hardly detectable by present analytical techniques.

Although an impurity in a cleaning agent is lowered to such a low level as to be hardly detectable, it is still difficult to provide a highly clean substrate surface. This is because it can not be avoided that a cleaning agent itself is contaminated with a metal impurity removed from a substrate in a cleaning tank. Thus, a metal impurity separated from a metal surface is incorporated into a cleaning agent and the metal impurity in the contaminated cleaning agent is then deposited on a substrate (reverse contamination).

In a step of cleaning semiconductors, cleaning (SC-1 cleaning) with "ammonia+hydrogen peroxide+water" solution is widely used (see RCA Review, p 187–206, June (1970) etc.). This cleaning is usually conducted at 40–90° C., and the composition ratio of a cleaning solution usually used is (30 wt % aqueous ammonia):(31 wt % hydrogen peroxide):(water)=0.05:1:5 to 1:1:5. However, this cleaning method has high performances to efficiently remove particles and organic materials, but when metals such as Fe, Al, Zn and Ni are present even in a very small amount in the solution, they are deposited on a substrate surface, thus raising a problem of reverse contamination. For this purpose, in the step of cleaning semiconductors, after cleaning with "ammonia+hydrogen peroxide+water" solution, cleaning with an acid cleaning agent such as "hydrochloric acid+hydrogen peroxide+water" solution (SC-2 cleaning) is usually conducted to remove metal contamination on a substrate surface.

Therefore, in the cleaning step, a technique to prevent the reverse contamination has been demanded in order to stably and efficiently provide a highly clean surface.

Further, a problem of deposition of metal impurities in a liquid onto a substrate surface is generally a large problem not only in the cleaning step but also in substrate surface treatment steps using a solution such as an alkali etching step of a silicon substrate, an etching step of a silicon oxide film with dilute hydrochloric acid, and the like. In the etching step with dilute hydrofluoric acid, when noble metal impurities such as Cu and Au are present in the solution, they are deposited on the silicon surface and extremely deteriorate electric properties of devices such as carrier lifetime. Although, in the alkali etching step, when a small amount of metal impurities such as Fe and Al are present in the solution, they are easily deposited on the substrate surface and adversely affect on its quality. Thus, a technique to prevent contamination in a surface treatment step with a solution is strongly demanded.

In order to solve these problems, there is proposed a method for preventing metal impurities from being deposited on a substrate surface by adding a complexing agent such as a chelating agent to a surface treatment agent to trap the metal impurities in the solution as stable water-soluble complexes. For example, JP-A-50-158281 proposes to prevent deposition of metal impurities on a semiconductor substrate surface by adding a complexing agent such as ethylenediaminetetraacetic acid (EDTA) or ammonium cyanide to a tetraalkylammonium hydroxide aqueous solution. JP-A-3-219000 proposes a chelating agent such as catechol and Tiron, JP-A-5-275405 proposes a phosphonic acid type chelating agent or a complexing agent such as condensed phosphoric acid and JP-A-6-163495 proposes a complexing agent such as hydrazone derivative, and they are respectively added to an alkaline cleaning solution such as "ammonia+hydrogen peroxide+water" solution to prevent metal impurity deposition on a substrate, thereby providing a substrate surface not contaminated with particles, organic materials and metals.

However, when these complexing agents are added, deposition of a specific metal (such as Fe) can be prevented or a removal effect can be recognized, but there are problems that the effect of the above-mentioned complexing agent is extremely small with regard to metals other than Fe (such as Al) which easily contaminate a treating solution or a substrate and that the effect can not be sufficiently achieved even by adding a large amount of complexing agents. In order to solvent these problems, JP-A-6-216098 proposes to clean a substrate with "ammonia+hydrogen peroxide+water" cleaning solution containing a chelating agent such as a phosphonic acid type chelating agent and then to rinse with a hydrofluoric acid aqueous solution of at least 1 ppm. According to this method, since the cleaning solution containing the phosphonic acid type chelating agent does not substantially reduce Al contamination on the substrate surface, Al is removed by etching with the hydrofluoric acid aqueous solution of at least 1 ppm at the later step. Thus, the effect achieved by the conventional method for preventing metal deposition is not satisfactory, and the metal contamination must be removed at the later stage when the substrate is required to be cleaner. Consequently, the number of steps must be increased, thereby making a production cost large.

Under these circumstances, various complexing agents have been tried to be added in order to prevent a substrate surface from being contaminated with metal impurities from a surface treatment composition, but a satisfactory improvement can not be made and a satisfactory technique for preventing contamination can not be achieved up to now.

The present invention has been made to solve the above-mentioned problems, and provides a surface treatment composition which prevents a substrate surface from being contaminated with metal impurities from the surface treatment composition and stably produces an extremely clean substrate surface, and also provides a method for treating the surface of a substrate by using the same.

DISCLOSURE OF THE INVENTION

According to the present invention, an effect of preventing a substrate from being deposited with metal impurities from a surface treatment composition is remarkably improved by incorporating specific at least 2 complexing agents as a metal deposition preventive into the surface treatment composition.

Also, the present invention includes a surface treatment composition containing only one kind of complexing agent which achieves an effect of preventing metal impurity deposition more satisfactorily than prior arts when the metal deposition preventive to be contained in the surface treatment composition is a specific complexing agent.

Further, the present invention includes a method for efficiently supplying lost components of a surface treatment composition when conducting surface treatment with the surface treatment composition and a method for purifying ethylenediaminediorthohydroxyphenylacetic acid (hereinafter sometimes referred to as EDDHA) which is one of the most satisfactory metal deposition preventives.

Thus, the first essential feature of the present invention resides in a method for treating the surface of a substrate with a surface treatment composition, wherein the surface treatment composition comprises a liquid medium containing a completing agent as a metal deposition preventive, the complexing agent comprising at least one member selected from the following Group A complexing agents and at least one member selected from the group consisting of the following Groups B1 to B6 complexing agents:

Group A: complexing agents having an aromatic hydrocarbon ring in the molecular structure thereof and at least one of an OH group and/or an O⁻ group bonded directly to a carbon atom constituting the ring;
Group B1: complexing agents having at least one nitrogen atom as a donor atom in the molecular structure thereof;
Group B2: complexing agents having at least one atom selected from halogen, sulfur and carbon atoms as a donor atom in the molecular structure thereof;
Group B3: complexing agents having at least one oxygen atom as a donor atom in the molecular structure thereof, but not having a carbonyl group and a carboxyl group and not having any one of nitrogen, halogen, sulfur and carbon atoms as a donor atom;
Group B4: carboxylic acid type complexing agents having at least one carboxyl group in the molecular structure thereof, but not having any one of nitrogen, halogen, sulfur and carbon atoms as a donor atom and not having a carbonyl group and a hydroxyl group;
Group B5: hydroxymono- or di-carboxylic acid type complexing agents having at most 4 hydroxyl groups in the molecular structure thereof, but not having any one of nitrogen, halogen, sulfur and carbon atoms as a donor atom and not having a carbonyl group; and
Group B6: complexing agents having at least one carbonyl group in the molecular structure thereof.

The second essential feature of the present invention resides in a method for treating the surface of a substrate with a surface treatment composition which contains at least one complexing agent selected from the group consisting of ethylenediaminediorthohydroxyphenylacetic acid [ethylenediamine-N,N'-bis(orthohydroxyphenylacetic acid)], 2-hydroxy-1-(2-hydroxy-5-methylphenylazo)-4-naphthalenesulfonic acid, diammonium 4,4'-bis(3,4-dihydroxyphenylazo)-2,2'-stilbenedisulfonate, Pyrocatechol Violet, o,o'-dihydroxyazobenzene, 1'2-dihydroxy-5-nitro-1, 2'-azonaphthalene-4-sulfonic acid and N,N'-bis(2-hydroxybenzyl)ethylenediamine-N,N'-diacetic acid as a metal deposition preventive in a liquid medium.

Further, the third essential feature of the present invention resides in a method for treating the surface of a substrate with a surface treatment composition, wherein the surface treatment composition is a composition containing an oxidizing agent and an organic complexing agent having an OH group bonded directly to an aromatic hydrocarbon group in a liquid medium and the concentration of the oxidizing agent is from 1 ppm by weight to 3 wt %.

The fourth essential feature of the present invention resides in a method for treating the surface of a substrate with an alkaline surface treatment composition containing ammonia, water and an organic completing agent having a cyclic structure in the molecular structure thereof and at least one of an OH group and/or an O⁻ group bonded to a carbon atom constituting the cyclic structure as a metal deposition preventive in a liquid medium, wherein an ammonia component evaporated during the surface treatment is supplied with an ammonia aqueous solution containing the organic complexing agent.

The fifth essential feature of the present invention resides in a method for treating the surface of a substrate with a surface treatment composition, wherein the surface treatment composition is a composition obtained by adding highly pure ethylenenediaminediorthohydroxyphenylacetic acid containing at most 5 ppm of at least one metal element of Fe, Al and Zn or its ammonium salt, as a metal deposition preventive to a liquid medium, and a method for purifying the highly pure ethylenediaminediorthohydroxyphenylacetic acid or its ammonium salt.

Hereinafter, the present invention is further described in more details.

The surface treatment composition used in the above-mentioned first invention is characterized by containing specific at least 2 complexing agents as a metal deposition preventive. The specific at least 2 complexing agents comprise at least one complexing agent selected from the following Group A and at least one complexing agent selected from the group consisting of the following Groups B1, B2, B3, B4, B5 and B6.

In the present invention, the surface treatment generally refers to cleaning, etching, polishing and coating of a substrate, and the surface treatment composition generally refers to a surface treating agent used for these purposes.

Group A complexing agents have an aromatic hydrocarbon ring in the molecular structure thereof and at least one of an OH group and/or an O⁻ group bonded to a carbon atom constituting the ring. Examples of these complexing agents are illustrated below, but are not limited thereto. Also, examples are illustrated by a compound having an OH group, but include its corresponding salt such as an ammonium salt and an alkali metal salt. Names in parenthesis [ ] after compound names refer to abbreviation or common names used in the present specification.

(A-1) Phenols Having Only One OH Group and Their Derivatives

Phenol, cresol, ethylphenol, t-butylphenol, methoxyphenol, salicyl alcohol, chlorophenol, aminophenol, aminocresol, amidol, p-(2-aminoethyl)phenol, salicylic acid, o-salicylanilide, naphthol, naphtholsulfonic acid, 7-amino-4-hydroxy-2-naphthalendisulfonic acid, and the like.

(A-2) Phenal Having at Least 2 OH Groups and Their Derivatives

Catechol, resorcinol, hydroquinone, 4-methylpyrocatechol, 2-methylhydroquinone, pyrogallol, 1,2,5-benzenetriol, 1,3,5-benzenetriol, 2-methylfluoroglucinol, 2,4,6-trimethylfluoroglucinol, 1,2,3,5-benzenetetraol, benzenehexanol, Tiron, aminoresorcinol, 2,4-dihydroxybenzaldehyde, 3,4-dihydroxybenzaldehyde, dihydroxyacetophenone, 3,4-dihydroxybenzoic acid, gallic acid, 2,3,4-trihydroxybenzoic acid, 2,4-dihydroxy-6-methylbenzoic acid, naphthalenediol, naphthalenetriol, nitronaphthol, naphthalenetetraol, binaphthyldiol, 4,5-dihydroxy-2,7-naphthalenedisulfonic acid, 1,8-dihydroxy-3,6-naphthalenedisulfonic acid, 1,2,3-anthracenetriol, 1,3,5-tris((2,3-dihydroxybenzoyl)aminomethyl)benzene [MECAM], 1,5,10-tris(2,3-dihydroxybenzoyl)-1,5,10-triazadecane [3,4-LICAM], 1,5,9-tris(2,3-dihydroxybenzoyl)-1,5,9cyclotriazatridecane [3,3,4-CYCAM], 1,3,5-tris((2,3-dihydroxybenzoyl)carbamide)benzene [TRIMCAM], entecrobactin, enancycloenterobactin and the like.

(A-3) Hydroxybenzophenones

Dihydroxybenzophenone, 2,3,4-trihydroxybenzophenone, 2,6-dihydroxy-4-methoxybenzophenone, 2,2',5,6'-tetrahydroxybenzophenone, 2,3',4,4',6-pentahydroxybenzophenone, and the like.

(A-4) Hydroxybenzanilides o-hydroxybenzanilide, and the like.

(A-5) Hydroxyanils

Glyoxalbis(2-hydroxyanil), and the like.

(A-6) Hydroxyphenyls

Biphenyltetraol, and the like.

(A-7) Hydroxyquinones and Their Derivatives 2,3-dihydroxy-1,4-naphthoquinone, 5-hydroxy-1,4-naphthoquinone, dihydroxyanthraquinone, 1,2-dihydroxy-3-(aminomethyl)anthraquinone-N,N'-diacetic acid [Alizarine complexane], trihydroxyanthraquinone, and the like.

(A-8) Diphenyl- or Triphenyl-alkane Derivatives

Diphenylmethane-2,2'-diol, 4,4',4"-triphenylmethanetriol, 4,4'-dihydroxyfuchsone, 4,4'-dihydroxy-3-methylfuchsone, Pyrocatechol Violet [PV], and the like.

(A-9) Phenol Derivatives of Alkylamines

Ethylenediaminediorthohydroxyphenylacetic acid [EDDHA], N,N-bis(2-hydroxybenzyl)ethylenediamine-N,N-diacetic acid [HBED], ethylenediaminedihydroxymethylphenylacetic acid [EDDHMA], and the like.

(A-10) Phenol Derivatives of Alkylethers 3,3'-ethylenedioxydiphenol, and the like.

(A-11) Phenols Having an Azo Group and Their Derivatives

Diammonium 4,4'-bis(3,4-dihydroxyphenylazo)-2,2'-stilbenedisulfonate [Stilbazo], 2,8-dihydroxy-1-(8-hydroxy-3,6-disulfo-1-naphthylazo)-3,6-naphthalenedisulfonic acid, o,o'-dihydroxyazobenzene, 2-hydroxy-1-(2-hydroxy-5-methylphenylazo)-4-naphthalenesulfonic acid [Carmagite], chlorohydroxyphenylazonaphthol, 1'2-dihydroxy-6-nitro-1,2'-azonaphthalene-4-sulfonic acid [Eriochrome Black T], 2-hydroxy-1-(2-hydroxy-4-sulfo-1-naphthylazo)-3,6-naphthalenedisulfonic acid, 5-chloro-2-hydroxy-3-(2,4-dihydroxyphenylazo)benzene sulfonic acid [Lumogalion], 2-hydroxy-1-(2-hydroxy-4-sulfo-1-naphthylazo)-3-naphthalic acid [NN], 1,8-dihydroxy-2-(4-sulfophenylazo)-3,6-naphthalenedisulfonic acid, 1,8-dihydroxy-2,7-bi(5-chloro-2-hydroxy-3-sulfophenylazo)-3,6-naphthalenedisulfonic acid, 1,8-dihydroxy-2,7-bis(2-sulfophenylazo)-3,6-naphthalenedisulfonic acid, 2-[3-(2,4-dimethylphenylaminocarboxy)-2-hydroxy-1-naphthylazo]-3-hydroxybenzene sulfonic acid, 2-[3-(2,4-dimethylphenylaminocarboxy)-2-hydroxy-1-naphthylazo]phenol, and the like.

In the first invention, at least one complexing agent selected from the above Group A is contained as a metal deposition preventive. A completing agent is selected by synthetically considering a cleaning level, a complexing agent cost, a chemical stability in a surface treatment composition and the like required for a substrate surface, and it is hard to say unconditionally which complexing agent is best. However, in respect of a metal deposition preventive effect, when the content of a complexing agent in a surface treatment composition is constant, phenol derivatives of alkylamines such as ethylenediaminediorthohydroxyphenylacetic acid [EDDHA] and phenols having at least 2 OH groups and their derivatives such as catechol and Tiron are excellent and are preferably used. Also, in respect of chemical stability, phenol derivatives of alkylamines such as ethylenediaminediorthohydroxyphenylacetic acid [EDDHA] are excellent, and in respect of a production cost of a complexing agent, 8-quinolinol, catechol, Tiron and the like are excellent and are preferably used when these factors are considered important. Further, a complexing agent having not only an OH group but also a sulfonic acid group and a carboxyl group, is excellent and preferable in respect of a metal deposition preventive effect and a chemical stability.

Examples of other complexing agents used in combination with a complexing agent of Group A, include complexing agents of the following Groups B1 to B6.

(Group B1) Complexing agents having at least one nitrogen atom as a donor atom in the molecular structure thereof.

(Group B2) Complexing agents having at least one atom selected from halogen, sulfur and carbon atoms as a donor atom in the molecular structure thereof.

(Group B3) Complexing agents having at least one oxygen atom as a donor atom in the molecular structure thereof, but not having a carbonyl group and a carboxyl group and not having any one of nitrogen, halogen, sulfur and carbon atoms as a donor atom.

(Group B4) Carboxylic acid type complexing agents having at least one carboxyl group in the molecular structure thereof, but not having any one of nitrogen, halogen, sulfur and carbon atoms as a donor atom and not having a carbonyl group and a hydroxyl group.

(Group B5) Hydroxymono- or di-carboxylic acid type complexing agents having at most 4 hydroxyl groups in the molecular structure thereof, but not having any one of nitrogen, halogen, sulfur and carbon atoms as a donor atom and not having a carbonyl group.

(Group B6) Complexing agents having at least one carbonyl group in the molecular structure thereof.

In the present invention, a donor atom means an atom which can provide electrons necessary for a coordinate bond with a metal. Examples of a coordinate group having a nitrogen atom as a donor atom in the Group B1, include an amino group, an imino group, a nitrilo group (tertiary nitrogen atom), a thiocyanate group, a hydroxyamino group, a hydroxyimino group, a nitro group, a nitroso group, a hydrazino group, a hydrazono group, a hydrazo group, an azo group, an azoxy group, a diazonium group and an azide group. Examples of complexing agents having these coordinate groups are illustrated below, but are not especially limited thereto.

(B1-1) Monoamines

Ethylamine, isopropylamine, vinylamine, diethylamine, dipropylamine, N-methylethylamine, triethylamine, benzylamine, aniline, toluidine, ethylaniline, xylidine, thymylamine, 2,4,6-trimethylaniline, diphenylamine, N-methyldiphenylamine, biphenylylamine, benzidine, chloroaniline, nitrosoaniline, aminobenzenesulfonic acid, aminobenzoic acid, and the like.

(B1-2) Diamines and Polyamines

Ethylenediamine, propylenediamine, trimethylenediamine, hexamethylenediamine, diethylenetriamine, diaminobenzene, toluenediamine, N-methylphenylenediamine, triaminobenzene, aminodiphenylamine, diaminophenylamine, and the like.

(B1-3) Amino Alcohols

Ethanol amine, 2-amino-1-butanol, 2-amino-2-methyl-1-propanol, 2-amino-2-ethyl-1,3-propanediol, 2-(ethylamino) ethanol, 2,2'-iminodiethanol, dimethylethanolamine, diethylethanolamine, ethyldiethanolamine, 3-diethylamino-1,2-propanediol, triethanolamine, and the like.

(B1-4) Aminophenols

Aminophenol, p-aminophenol sulfate, (methylamino) phenol, aminoresorcinol, and the like.

(B1-5) Amino Acids

Glycine, glycineethylester, sarcosine, alanine, aminobutyric acid, norvaline, valine, isovaline, norleucine, leucine, isoleucine, serine, L-threonine, cysteine, cystine, methionine, ornithine, lysing, arginine, citrulline, asparagic acid, asparagine, glutamic acid, glutamine, p-hydroxyglutamic acid, N-acetylglycine, glycylglycine, diglycylglycine, phenylalanine, tyrosine, L-thyroxine, N-phenylglycine, N-benzoylglycine, and the like.

(B1-6) Iminocarboxylic Acids

Iminodiacetic acid, nitrilotriacetic acid, nitrilotripropionic acid, ethylenediaminediacetic acid [EDDA], ethylenediaminetetraacetic acid [EDTA], hydroxyethylethylenediaminetetraacetic acid [EDTA-OH], trans-1,2-diaminocyclohexanetetraacetic acid [CyDTA], dihydroxyethylglycine [DHGE], diaminopropanoltetraacetic acid [DPTA-OH], diethylenetriaminepentaacetic acid [DTPA], ethylenediaminedipropiondiacetic acid [EDDP], glycol ether diaminetetraacetic acid [GEDTA], 1,6-hexamethylenediaminetetraacetic acid [HDTA], hydroxyethyliminodiacetic acid [HIDA], methylEDTA (diaminopropanetetraacetic acid), triethylenetetraminehexaacetic acid [TTHA], 3,3'-dimethoxybenzidine-N,N,N'N'-tetraacetic acid, and the like.

(B1-7) Iminophosphonic Acids

Ethylenediamine-N,N'-bis(methylenephosphonic acid) [EDDPO], ethylenediaminetetrakis(methylenephosphonic acid) [EDTPO], nitrilotris(methylenephosphonic acid) [NTPO], diethylenetriaminepenta(methylenephosphonic acid) [ETTPO], propylenediaminetetra (methylenephosphonic acid) [PDTMP] and the like.

(B1-8) Heterocyclic Amines

Pyridines such as pyridine, conyrine, lutidine, picoline, 3-pyridinol, isonicotinic acid, picolinic acid, acetylpyridine, nitropyridine, 4-pyridone, bipyridyl, 2,4,6-tris(2-pyridyl)-1,3,5-triazine [TPTZ], 3-(2-pyridyl)-5,6-bis(4-sulfonyl)-1,2,4-triazine [PDTS], synphenyl-2-pyridylketoxime [PPKS], and the like; quinolines such as quinoline, quinaldine, lepidine, dimethylquinoline, 8-quinolinol, 2-methyl-8-quinolinol, methoxyquinoline, chloroquinoline, quinolinediol, quinaldinic acid, quinic acid, nitroquinoline, kynurine, kynurenic acid, 8-acetoxyquinoline, bicinchonic acid, and the like; isoquinolines; benzoquinolines such as acridine, 9-acridone, phenanthridine, benzoquinoline, benzoisoquinoline, and the like; naphthoquinolines such as naphthoquinoline and the like; and phenanthrolines such as o-phenanthroline, 2,9-dimethyl-1,10-phenanthroline, basocuproin, basocuproin sulfonic acid, basophenonethroline, basophenanthrolinesulfonic acid, 2,9-dimethyl-4,7-diphenyl-1,10-phenanthroline, and the like.

Further, pyrazoles such as pyrazole, 5-pyrazolone, and the like; imidazoles such as imidazole, methylimidazole, and the like; imidazolines and imidazolidines such as 2-imidazoline, imidazolidine, ethyleneurea, and the like; benzoimidazoles such as benzoimidazole and the like; diazines such as diazine, pyrimidine, pyrazine, and the like; hydropyrimidines such as uracyl, thymine, and the like; piperazines such as piperazine, and the like; benzodiazines and dibenzodiazines such as cinnoline, phenazine, and the like; triazines; purines; oxazoles and isooxazoles such as oxazole, 4-oxazolone, isooxazole, azoxime and the like; oxazines such as 4H-1,4-oxazine, morpholine, and the like; thiazoles and benzothiazoles; isothiazoles; thiazines; pyrroles; pyrrolines and pyrrolidines; indoles, indolines; isoindoles; carbazoles; inindigos; porphyrins; and the like.

(B1-9) Amides and Imides

Carbamic acid, ammonium carbamate, oxamic acid, ethyl oxamate, ethyl N-nitrocarbamate, carbanilic acid, carbonylonitrile, oxanylic acid, formamide, diacetamide, hexaneamide, acrylamide, lactic acid amide, cyanoacetamide, oxamide, succinamide, salicylamide, nitrobenzamide, succinimide, maleimide, phthalic imide, and the like.

(B1-10) Anilides

Formanilides, acetanilide, hydroxyanilide, chloroanilide, methoxyacetanilide, oxanilide, and the like.

(B1-11) Urea, Thiourea and its Derivatives

Urea, N-methyl urea, N,N'-ethylidene urea, allophanic acid, glycoluric acid, oxaluric acid, buret, N-nitro urea, azodicarboneamide, thiourea, methylthiourea, dimethylthiourea, and the like.

(B1-12) Oximes

Formaldoxime, p-benzoquinonedioxime, benzaldoxime, benzyldioxime, and the like.

(B1-13) Compounds Containing a Coordinate Group Having Nitrogen Atoms Bonded to Each Other As hydrazines and hydrazides of azobenzene, azotoluene, Methyl Red, azobenzene dicarboxylic acid, hydroxyazobenzene, azoxybenzene and the like: azo and azoxy compounds including phenylhydrazine, p-bromophenylhydrazine, p-nitrophenylhydrazine, N',-phenylacetohydrazide and the like; hyrazo compounds including hydrazobenzene, hydrazodibenzoic acid and the like; hydrazones including oxalic bis (salicylidenehydrazide), salicylaldehyde (2-carboxyphenyl) hydrazone, benzaldehyde hydrazone, acetaldehydephenylhydrazone and the like; azines including benzylideneazine and the like; azides including benzoylazide and the like;

diazonium salts including benzene diazonium chloride and the like; diazo compounds including benzenediazohydroxide and the like; semicarbazides including semicarbazide and the like; and thiosemicarbazides including thiosemicarbazide and the like.

(B1-14) Others

Azides such as ammonium azide, sodium azide and the like; nitriles such as acetonitrile and the like; amidosulfuric acid, imidodisulfuric acid, nitridetrisulfuric acid, thiocyanic acid, ammonium thiocyanate, and the like.

In respect to a metal deposition preventive effect, when a content of a complexing agent in a surface treatment composition is constant, among the above Group B1, particularly amino acids such as glycine, iminocarboxylic acids such as iminodiacetic acid, nitrilotriacetic acid and ethylenediaminetetraacetic acid [EDTA], and heterocyclic polycycloamines such as 8-quinolinol and o-phenanthroline, are excellent and preferably used.

Complexing agents of Group B2 include complexing agents having at least one atom selected from halogen, sulfur and carbon atoms as a donor atom in the molecular structure thereof. Examples of these complexing agents having such a donor atom are illustrated below, but are not especially limited thereto. Also, salts of the following illustrated complexing agents include alkali metal salts or ammonium salts.

(B2-1) Complexing Agents Having a Halogen Atom as a Donor Atom

Hydrofluoric acid or its salt, hydrochloric acid or its salt, hydrogen bromide or its salt, hydrogen iodide or its salt.

(B2-2) Complexing Agents Having a Sulfur Atom as a Donor Atom

Compounds selected from thiol, sulfide or thiocarbonyl compounds expressed by RSH, R'$_2$S or R$_2$C=S or having at least one coordinate group expressed by the formula HS$^-$, S$^{2-}$, S$_2$O$_3^{2-}$, RS$^-$, R—COS$^-$, R—CSS$^-$ or CS$_3^{2-}$. In the above formulas, R is an alkyl group, and R' is an alkyl group or an alkenyl group, and they may be bonded to form a ring containing a sulfur atom. Examples of these compounds include compounds having a HS$^-$ group or a S$^{2-}$ group such as hydrogen sulfide or its salt, or sulfides including sodium sulfide, ammonium sulfide and the like; compounds having a S$_2$O$_3^{2-}$ group such as thiosulfuric acid or its salt; compounds having a RSH or RS$^-$ group such as lower alkylthiol including thiol, ethanethiol and 1-propanethiol or their salts; compounds having a R—COS$^-$ group such as thioacetic acid, dithiooxalic acid or their salts; compounds having a R—CSS$^-$ group such as ethanedibis(dithio acid), dithioacetic acid or their salts; compounds having a CS$_3^{2-}$ group such as trithiocarbonic acid or their salts or thiocarbonic acid esters including diethyl trithiocarbonate and the like; sulfides expressed by R'$_2$S such as methylsulfide, methylthioethane, diethylsulfide, vinyl sulfide, benzothiophene and the like; and thiocarbonyl compounds expressed by R$_2$C=S group such as propanethion, 2,4-pentanedion and the like.

(B2-3) Complexing Agents Having a Carbon Atom as a Donor Atom

Examples of these compounds include compounds having a NC$^-$, RNC or RCC$^-$ group as a coordinate group. Particular examples include cyanides such as hydrogen cyanide and ammonium cyanide, isocyanides such as ethyl isocyanide, allylene, metal acetylide and the like.

Among the above Group B2, a complexing agent having halogen as a donor atom such as hydrofluoric acid and hydrochloric acid, are excellent in respect to both metal deposition preventive effect and cost, and are preferably used.

Complexing agents of Group B3 include complexing agents having at least one oxygen atom as a donor atom in the molecular structure thereof, but not having a carbonyl group and a carboxyl group and not having any one nitrogen, halogen, sulfur and carbon atoms as a donor atom. Examples of these complexing agents are illustrated below, but are not especially limited thereto. The following illustrated acids such as sulfonic acid and oxo acid are described as an acid, but their salts such as alkali metal salts or ammonium salts are included therein.

(B3-1) Complexing Agents Having a Hydroxyl Group

Saturated alcohols such as methanol, ethanol, propanol, isopropyl alcohol, butanol, pentanol, hexanol, benzyl alcohol and the like; unsaturated alcohols such as allyl alcohol, methyl vinyl carbinol and the like polyhydric alcohols such as ethylene glycol, glycerine and the like; phenols such as phenol, catechol, Tiron and the like; and their derivatives.

(B3-2) Complexing Agents Having a Phosphoric Acid Group

Benzene phosphonic acid and the like.

(B3-3) Complexing Agents Having a Sulfonic Acid Group

Aliphatic sulfonic acids such as methanesulfonic acid and ethanesulfonic acid; and aromaticsulfonic acids such as benzenesulfonic acid, dodecylbenzenesulfonic acid and naphthalenesulfonic acid.

(B3-4) Complexing Agents Having an Ether Group

Dimethoxymethane, 1,4-dioxane, and the like.

(B3-5) Oxo Acids

Suluric acid, phosphoric acid, condensed phosphoric acid, boric acid, silicic acid, carbonic acid, nitric acid, nitrous acid, perchloric acid, chloric acid, chlorous acid, hypochlorous acid, and the like.

(B3-6) Acid Esters

Sulfuric acid esters such as ethylsulforic acid, dimethylsulforic acid and the like, carbonic acid esters such as dimethyl carbonate, diphenyl carbonate and the like, phosphoric acid esters such as trimethyl phosphate, triphenyl phosphate and the like, trimethyl borate, ethyl nitrate, ethyl nitride, and the like.

Among the above Group B3, particularly, aliphatic alcohols such as isopropyl alcohol and oxo acids such as phosphoric acid and nitrous acid are excellent and preferably used in respect to both metal deposition preventive effect and cost.

Complexing agents of B4 Group are carboxylic acid type complexing agents having at least one carbonyl group in the molecular structure thereof, but not having any one of nitrogen, halogen, sulfur and carbon atoms as a donor atom and not having a carbonyl group and a hydroxyl group. Examples of Group B4 complexing agents are illustrated below, but are not especially limited thereto. Also, carboxylic acids are illustrated as a free acids, but their salts such as ammonium salts and alkali metal salts are included therein.

(B4-1) Monocarboxylic Acids

Formic acid, acetic acid, propionic acid, butyric acid, isobutyric acid, valeric acid, decanoic acid, undecanoic acid, dodecanoic acid, stearic acid, acrylic acid, crotonic acid, oleic acid, monochloroacetic acid, dichloroacetic acid, trichloroacetic acid, fluoroacetic acid, benzoic acid, methylbenzoic acid, chlorobenzoic acid, sulfocarboxylic acid, phenylacetic acid, and the like.

(B4-2) Polycarboxylic Acids

Oxalic acid, malonic acid, succinic acid, maleic acid, fumaric acid, 1,2,3-propanetricarboxylic acid, chlorosuccinic acid, phthalic acid, 1,3,5-benzenetricarboxylic acid, dichlorophthalic acid, phenylsuccinic acid, and the like.

Among the above Group B4, particularly, carboxylic acids having a relatively simple structure, i.e. $C_2$–$C_3$ aliphatic saturated carboxylic acids such as acetic acid and oxalic acid are excellent and preferably used in respect to both metal deposition preventive effect and cost.

Complexing agents Group B5 are hydroxymono- or dicarboxylic acid type complexing agents having at most 4 hydroxyl groups in the molecular structure thereof, but not having any one of nitrogen, halogen, sulfur and carbon atoms as a donor atom and not having a carbonyl group. In the present invention, a donor atom means an atom which can provide electrons necessary for a coordinate bond with a metal. Examples of Group B complexing agents are illustrated below, but are not especially limited thereto. The following hydroxycarboxylic acids are illustrated as a free acid, but their ammonium salts, alkali metal salts and the like are included therein.

(B5-1) Hydroxymonocarboxylic Acids Having at Most 4 Hydroxyl Groups

Hydroxymonocarboxylic acids having one hydroxyl group such as glycolic acid, lactic acid, 2-hydroxybutyric acid, hydroacrylic acid, hydroxybenzoic acid, salicylic acid, sulfosalicylic acid and the like, hydroxymonocarboxylic acids having two hydroxyl groups such as glyceric acid, 8,9-dihydroxystearic acid, 2,4-dihydroxybenzoic acid, protecatechuic acid and the like, and hydroxymonocarboxylic acids having three hydroxyl groups such as gallic acid and the like.

(B5-2) Hydroxydicarboxylic Acids Having at Most 4 Hydroxyl Groups

Hydroxydicarboxylic acids having one hydroxyl group such as tartronic acid, malic acid, 2-hydroxybutanediacetic acid, 2-hydroxydodecanediacetic acid, hydroxyphthalic acid and the like, hydroxydicarboxylic acids having two hydroxyl groups such as tartaric acid, 3,4-dihydroxyphthalic acid and the like, and hydroxydicarboxylic acids having four hydroxyl groups such as tetrahydroxysuccinic acid and the like.

Among the above Group B5, particularly, hydroxydicarboxylic acids or hydroxymonocarboxylic acids having at most 2 hydroxyl groups, such as tartaric acid salicylic acid, sulfosalicylic acid and the like are excellent and preferably used in respect to metal deposition preventive effect, chemical stability and cost.

On the other hand, hydroxycarboxylic acids having at least 3 carboxyl groups such as citric acid do not achieve a satisfactorily metal deposition preventive effect, and hydroxycarboxylic acids having at least 5 hydroxyl groups such as gluconic acid, galactonic acid and the like are not preferable since they are generally poor in chemical stability and do not achieve a stable metal deposition preventive effect.

Further, a metal deposition preventive effect is related to the positions of a hydroxyl group and a carboxyl group in a molecule and it is preferable that he two groups are bonded to carbon atoms closely positioned.

Complexing agents of Group B6 include complexing agents having at least one carbonyl group in the molecular structure thereof, but not having any one of nitrogen, halogen, sulfur and carbon atoms as a donor atom in the molecular structure thereof. Examples of these complexing agents in the present invention are illustrated below, but are not especially limited thereto.

(B6-1) Aliphatic Aldehydes

Formaldehyde, acetaldehyde, propionaldehyde, isobutylaldehyde, acrylaldehyde, crotonaldehyde, chloroacetaldehyde, dichloroacetaldehyde, butylchloral, hydroxyacetaldehyde, lactaldehyde, D-glycerinaldehyde, formal, acetal, dichloroacetal, and the like.

(B6-2) Aliphatic Ketones

Acetone, ethyl methyl ketone, 2-methylpentanone, 3-pentanone, 3-methyl-2-butanone, 4-methyl-2-pentanone, pinacolin, 2-heptanone, 3-heptanone, 4-heptanone, 6-methyl-heptahnone, diisobutyl ketone, di-tert-butyl ketone, dihexyl ketone, methyl vinyl ketone, allylacetone, 1-chloro-2-propanone, 1,1-dichloro-2-propanone, hydroxyacetone, dihydroxyacetone, and the like.

(B6-3) Polyoxo Compounds

Di-, and poly-aldehydes such as glyoxal, malonaldehyde, succinealdehyde, and the like, di-, and poly-ketones such as diacetyl, acetylacetone, acetonylacetone, diacetylacetone, and the like, and ketoaldehydes such as pyruvine aldehyde, 4-oxopentanal, and the like.

(B6-4) Ketenes

Ketene, dimethylketene, and the like.

(B6-5) Ketocarboxylic Acids and Aldehydecarboxylic Acids 4,4,4-trifluoro-1-phenyl-1,3-butanedione, 2,2,6,6-tetramethyl-3,5-heptanedione, pyruvic acid, malonealdehyde acid, acetacetic acid, glyoxlic acid, mesooxalic acid, oxalacetic acid, oxaloglutaric acid, and the like.

(B6-6) Aromatic Aldehydes and Aromatic Ketones

Benzaldehyde, tolualdehyde, phenylacetaldehyde, cinnamaldehyde, terephthalaldehyder, protocatecaldehyde, acetophenone, methylacetophenone, benzophenone, chloroacetophenone, dihydroxybenzophenone, phenylglyoxal, and the like.

(B6-7) Quinones o-benzoquinone, p-benzoquinone, naphthoquinone, quinhydrone, 2,6-dichloro-p-benzoquinone, 2,5-dihydroxy-p-benzoquinone, tetrahydroxy-p-benzoquinone, 2,3-hydroxy-1,4-naphthoquinone, and the like (B6-8) Tropolones Tropolone, 6-isopropyltropolone, and the like.

The second invention of the present invention resides in that a satisfactory metal deposition preventive effect can be achieved even by only one kind of complexing agent when the complexing agent to be added to a liquid medium is ethylenediaminediorthohydroxyphenylacetic acid [EDDHA], 2-hydroxy-1-(2-hydroxy-5-methylphenylazo)-4-naphthalenesulfonic acid [Carmagite], diammonium 4,4'-bis (3,4-dihydroxyphenylazo)-2,2'-stilbenedisulfonate [Stilbazo], Pyrocatechol Violet [PV], o,o'-dihydroxyazobenzene, 1'2-dihydroxy-5-nitro-1,2'-azonaphthalene-4-sulfonic acid [Eriochrome Black T] or N,N-bis(2-hydroxybenzyl)ethylenediamine-N,N-diacetic acid [HBED].

An amount of a complexing agent to be added as a metal deposition preventive can not be simply determined since the amount added is depending on the kind and amount of a metal impurity in a liquid medium, the deposition of which is prevented, and a cleaning level demanded for a substrate surface, but the total amount to be added in a surface treatment composition is generally from $10^{-7}$ to 2 wt %, preferably from $10^{-6}$ to 0.5 wt %, more preferably from $10^{-6}$ to 0.1 wt %. If the above amount is too small, the aimed metal deposition preventive effect of the present invention is hardly achieved. On the other hand, if the above amount is too large, the aimed effect can not be achieved any further and there is a fear that the complexing agent as a metal deposition preventive tends to be unfavorably deposited on a substrate surface.

Examples of a liquid medium used as the main component for a surface treatment composition of the present invention include generally water, electrolyzed ionic water, an organic solvent or an aqueous solution having an acid, an alkali, an oxidizing agent, a reducing agent, a surfactant or the like dissolved, or their mixture solutions. Particularly when an alkaline aqueous solution or a dilute hydrofluoric acid solution is used for cleaning or etching a semiconductor substrate, metal impurities in the solution are very easily deposited on a substrate surface, and therefore in such cases, it is preferable to use these solutions by adding a complexing agent in accordance with the present invention.

In the present invention, the alkaline aqueous solution means generally an aqueous solution having a pH value of higher than 7. Examples of an alkaline component in this aqueous solution are not especially limited, but typically include ammonia. Also, other usable examples include alkali metal or alkali earth metal hydroxides such as sodium hydroxide, potassium hydroxide and calcium hydroxide, alkaline salts such as sodium hydrogen carbonate and ammonium hydrogen carbonate, or quaternary ammonium salt hydroxides such as tetramethylammonium hydroxide (TMAM), trimethyl-2-hydroxyethylammonium hydroxide and choline, and the like. These alkalis may be added in a mixture of two or more, and the total concentration of the total solution of surface treatment composition is adjusted to from 0.01 to 30 wt %. Also, alkali electrolyzed ionic water obtained by electrolysis of water is preferably used. Further, to such an alkaline aqueous solution, an oxidizing agent such as hydrogen peroxide may be optionally added. In a cleaning step of semiconductor wafer, when cleaning bare silicon (having no oxidized film), it is possible to control etching or surface-roughening of the wafer by incorporating an oxidizing agent. When hydrogen peroxide is incorporated into the alkaline aqueous solution of the present invention, the hydrogen peroxide concentration in the total solution of surface treatment composition is generally adjusted within the concentration range of from 0.01 to 30 wt %. When an oxidizing agent is used, the oxidizing agent concentration is preferably adjusted to from 1 ppm by weight to 3 wt %. If the amount of the oxidizing agent is too large, a complexing agent is decomposed, and the stability of the surface treatment composition tends to become poor. Particularly, when hydrogen peroxide is used as the oxidizing agent, the hydrogen peroxide concentration is preferably from 100 ppm by weight to 3 wt %.

Method for blending the complexing agent of the present invention with a surface treatment composition is not especially limited. The complexing agent may be blended previously with one component or plural components of the components constituting a surface treatment composition (such as aqueous ammonia, hydrogen peroxide, water and the like), and then these components may be mixed. Alternatively, the complexing agent may be blended with a mixture solution obtained after mixing the components. Also, when acids such as phenols, amino acids, iminocarboxylic acids and the like, are added, these acids may be added in the form of an acid or they may be added in the form of a salt such as an ammonium salt.

In the case of SC-1 cleaning, surface treatment is carried out with a composition of (ammonia+hydrogen peroxide+water+metal deposition preventive), but when the surface treatment composition is used for a long time, ammonia is evaporated and the metal deposition preventive is gradually decomposed, thereby degrading the metal deposition preventive effect. Therefore, when the evaporated ammonia content is supplied, the supplement is conducted preferably with an aqueous ammonia containing a metal deposition preventive in an amount of from $10^{-7}$ to 5 wt %, preferably from $10^{-6}$ to 1 wt %.

The surface treatment composition of the present invention is used for surface treatment operations including cleaning, etching, polishing, film-forming and the like, for substrates such as semiconductor, metal, glass, ceramics, plastic, magnetic material, superconductor and the like, the metal impurity contamination of which becomes troublesome. The present invention is preferably applied particularly to cleaning or etching of a semiconductor substrate, the surface of which is demanded to be highly clean. Among the cleaning operations of semiconductor substrate, when the present invention is applied particularly to alkali cleaning with a cleaning solution comprising (ammonia+hydrogen peroxide+water), the problem of said cleaning method, i.e. the problem of metal impurity deposition on a substrate can be solved, and by this cleaning, there can be satisfactorily provided a highly clean substrate surface without being contaminated with particles, organic materials and metals.

The reason why the surface treatment composition of the present invention achieves a very satisfactory effect of preventing deposition of metal impurities, is not clear up to now, but it is considered that some mixing effect is achieved and some stable water-soluble metal complex is effectively formed between metal ions and specific two or more complexing agents added.

When the surface treatment composition of the present invention is used as a cleaning solution for cleaning a substrate, a method of bringing the cleaning solution directly into contact with the substrate is employed. Examples of such a cleaning method include dipping type cleaning wherein a substrate is dipped in the cleaning solution in a cleaning tank, spraying type cleaning wherein the cleaning solution is sprayed on a substrate, spinning type cleaning wherein the cleaning solution is dropped on a substrate rotated at a high speed, and the like. In the present invention, among the above-mentioned cleaning methods, a suitable method is employed depending on an object, but the dipping type cleaning method is preferable. The cleaning is carried out for a suitable time, preferably from 10 seconds to 30 minutes, more preferably from 30 seconds to 15 minutes. If the cleaning time is too short, the cleaning effect is not satisfactory. On the other hand, if the cleaning time is too long, it is meaningless since the throughput becomes poor and the cleaning effect is not raised any further. The cleaning may be carried out at normal temperature, but may be carried out at a heated temperature to improve the cleaning effect. Also, the cleaning may be carried out in combination with a cleaning method employing a physical force.

Examples of the cleaning method employing a physical force include ultrasonic cleaning, mechanical cleaning employing a cleaning brush, and the like.

In the present invention, in the preparation of a surface treatment composition, a complexing agent sometimes becomes a metal contamination source. An ordinary reagent for the complexing agent contains metal impurities such as Fe in an amount of from several to several thousands ppm. These metal impurities are present as a stable complex with the complexing agent at the initial stage, but when the complexing agent is used as a surface treatment solution for a long time, the complexing agent is decomposed and metals become free and are deposited on the substrate surface. Therefore, the content of at least one metal element of Fe, Al and Zn in the complexing agent to be used is preferably at most 5 ppm, and it is particularly preferable that the Fe content is at most 5 ppm, the Al content is at most 2 ppm and the Zn content is at most 2 ppm. In order to obtain such a complexing agent, when the complexing agent to be used is EDDHA, EDDHA is purified by dissolving EDDHA or its salt in an acidic or alkaline solution, removing insoluble impurities by filtration, precipitating a crystal of EDDHA by neutralization and finally separating the crystal from the solution.

BEST MODE FOR CARRYING OUT THE INVENTION

Now, the present invention will be described in further detail with reference to Examples. However, it should be understood that the present invention is not limited to such specific Examples within the scope of the subject matter of the present invention.

EXAMPLES 1 TO 8 (USE OF SINGLE COMPLEXING AGENT) AND COMPARATIVE EXAMPLES 1 TO 3

Aqueous ammonia (30 wt %), hydrogen peroxide (31 wt %) and water were mixed in a volume ratio of 0.25:1:5, and to the aqueous solvent thus obtained, was added a predetermined amount of each complexing agent shown in the following Table 1 as a metal deposition preventive to prepare a surface treatment composition. The amount of the complexing agent added was expressed by wt %, and the name of the complexing agent was expressed by the above-mentioned common name. Comparative Examples were prepared respectively by adding ethylenediamine tetrakis (methylsulfonic acid) (common name: EDTPO) disclosed in JP-A-5-275405 as a complexing agent; by adding oxalic bis(salicylidenehydrazide) disclosed in JP-A-6-163496 as a complexing agent; or by adding no complexing agent.

To each of the surface treatment solutions, was added 10 ppb of each of Al and Fe (by using chlorides), and a clean silicon wafer (p type, CZ, plane orientation (100)) was dipped for 10 minutes in each of the surface treatment solutions. During dipping, a liquid temperature of each surface treatment solution was raised and maintained at 40–50° C. After dipping, each silicon wafer was overflow-rinsed with ultra-pure water for 10 minutes, and was dried with nitrogen blow to determine Al and Fe deposited on the wafer surface. Al and Fe deposited on the silicon wafer were recovered with a mixture solution of 0.1 wt % of hydrofluoric acid and 1 wt % of hydrogen peroxide, and the metal amounts were measured by flameless atomic absorption spectrometry and were converted into a substrate surface concentration (atoms/cm$^2$). The results are shown in the following Table 1.

TABLE 1

| | Metal deposition preventive | Added amount (wt %) | Metal deposit amount ($\times 10^{10}$ atoms/cm$^2$) | |
|---|---|---|---|---|
| | | | Al | Fe |
| Example 1 | EDDHA | 0.01 | 28 | <6 |
| Example 2 | EDDHA | 0.1 | 27 | <6 |
| Example 3 | Carmagite | 0.1 | 35 | <6 |
| Example 4 | Stilbazo | 0.1 | 80 | <6 |
| Example 5 | PV | 0.1 | 84 | <6 |
| Example 6 | o,o'-dihydroxyazobezene | 0.1 | 89 | <6 |
| Example 7 | Eriochrome Black T | 0.1 | 110 | <6 |
| Example 8 | HBED | 0.1 | 120 | <6 |
| Comparative Example 1 | none | 0 | 1800 | 200 |
| Comparative Example 2 | EDTPO | 0.1 | 330 | <6 |
| Comparative Example 3 | Oxalic bis(salicylidene-hydrazide) | 0.1 | 1700 | <6 |

EXAMPLES 9 TO 23 (COMBINATION USE OF A GROUP AND B1 GROUP) AND COMPARATIVE EXAMPLES 4 TO 15

Aqueous ammonia (30 wt %), hydrogen peroxide (31 wt %) and water were mixed in a volume ratio of 0.25:1:5, the mixture solution thus obtained was used as the main component for forming an aqueous solvent. To the aqueous solvent thus formed, was added a predetermined amount of at least 2 specific complexing agents of the present invention disclosed in Table 1 to prepare a surface treatment composition of the present invention. Comparative Examples were prepared respectively by adding one of the complexing agents used in Examples; by adding catechol, Tiron or (catechol+citric acid) disclosed in JP-A-3-219000 as a complexing agent; by adding EDPPO (ethylenediaminetetrakis (methylsulfonic acid)) disclosed in JP-A-5-275405 as a complexing agent; by adding oxalic bis (salicylidenehydrazide) disclosed in JP-A-6-163495 as a complexing agent; or adding no complexing agent. However, it should be noted that Comparative Example 4 is the same as Comparative Example 1; that Comparative Example 5 is the same as Example 1; that Comparative Example 6 is the same as Example 2; and that Comparative Example 13 is the same as Comparative Example 3.

To the surface treatment solutions thus prepared, were added 10 ppb of each of Al and Fe (by using chlorides), and a clean silicon wafer (p type, CZ, plane orientation (100)) was dipped for 10 minutes in each of the surface treatment solutions. During dipping, a liquid temperature of each surface treatment solution was raised and maintained at 40–50° C. After dipping, the silicon wafer was overflow-rinsed with ultra-pure water for 10 minutes and was then dried by nitrogen blow to determine Al and Fe deposited on the wafer surface. Al and Fe deposited on the wafer were recovered with a mixture solution of 0.1 wt % of hydrofluoric acid and 1 wt % of hydrogen peroxide, and the metal amounts were measured by flameless atomic absorption spectrometry and were converted into a substrate surface concentration (atoms/cm$^2$). The results are shown in the following Table 2.

TABLE 2

| Example No. | Metal deposition preventive (added amount/wt %) A Group | B1 Group | Metal deposit amount (×10¹⁰ atoms/cm²) Al | Fe |
|---|---|---|---|---|
| Example | | | | |
| 9 | EDDHA (0.01) | 8-xylenol (0.01) | <9 | <6 |
| 10 | EDDHA (0.01) | glycine (0.01) | <9 | <6 |
| 11 | EDDHA (0.01) | o-phenanthroline (0.01) | <9 | <6 |
| 12 | catechol (0.01) | 8-xylenol (0.01) | <9 | <6 |
| 13 | Tiron (0.01) | 8-xylenol (0.01) | <9 | <6 |
| 14 | Tiron (0.01) | o-phenanthroline (0.01) | <9 | <6 |
| 15 | Tiron (0.01) | glycine (0.01) | <9 | <6 |
| 16 | Tiron (0.01) | iminodiacetic acid (0.01) | <9 | <6 |
| 17 | Tiron (0.01) | nitrolotriacetic acid (0.01) | <9 | <6 |
| 18 | Tiron (0.01) | EDTA (0.01) | <9 | <6 |
| 19 | Tiron (0.01) | ethylenediamine (0.01) | 40 | <6 |
| 20 | Tiron (0.01) | triethanolamine (0.01) | 44 | <6 |
| 21 | Tiron (0.01) | oxalic bis(salicylidene-hydrazide) (0.01) | <9 | <6 |
| 22 | Tiron (0.01) | sodium azide (0.01) | 44 | <6 |
| 23 | Tiron (0.01) | acetonitrile (0.01) | 18 | <6 |

| Example No. | Metal deposition preventive (added amount/wt %) | Metal deposit amount (×10¹⁰ atoms/cm²) Al | Fe |
|---|---|---|---|
| Comparative Example | | | |
| 4 | none | 1800 | 200 |
| 5 | EDDHA (0.01) | 28 | <6 |
| 6 | EDDHA (0.1) | 27 | <6 |
| 7 | catechol (0.01) | 330 | <6 |
| 8 | Tiron (0.01) | 300 | <6 |
| 9 | 8-xylenol (0.01) | 1700 | 77 |
| 10 | 8-xylenol (0.1) | 130 | <6 |
| 11 | o-phenanthroline (0.1) | 1800 | 40 |
| 12 | EDTA (0.01) | 1700 | 51 |
| 13 | EDTPO (0.1) | 330 | <6 |
| 14 | oxalic bis(salicylidenehydrazide) (0.1) | 1700 | <6 |
| 15 | catechol (0.01) + citric acid (0.01) | 300 | <6 |

EXAMPLES 24 TO 28 (COMBINATION USE OF A GROUP AND B3 GROUP) AND COMPARATIVE EXAMPLE 16

The same procedure as in Example 9 was repeated, except that complexing agents shown in the following Table 3 were used. The results are shown in the following Table 3.

TABLE 3

| Example No. | Metal deposition preventive (added amount/wt %) A Group | B2 Group | Metal deposit amount (×10¹⁰ atoms/cm²) Al | Fe |
|---|---|---|---|---|
| Example | | | | |
| 24 | EDDHA (0.01) | HF (0.01) | <9 | <6 |
| 25 | EDDHA (0.01) | HCl (0.01) | <9 | <6 |
| 26 | Tiron (0.01) | HF (0.01) | 35 | <6 |
| 27 | Tiron (0.01) | HCl (0.01) | 35 | <6 |
| 28 | Tiron (0.01) | benzothiophene | 71 | <6 |
| Comparative Example 16 | HF (0.1) | | 1100 | 1000 |

EXAMPLES 29 TO 39 (COMBINATION USE OF A GROUP AND B3 GROUP)

The same procedure as in Example 9 was repeated, except that complexing agents shown in the following Table 4 were used. The results are shown in the following Table 4.

TABLE 4

| Example No. | Metal deposition preventive (added amount/wt %) A Group | B3 Group | Metal deposit amount (×10¹⁰ atoms/cm²) Al | Fe |
|---|---|---|---|---|
| Example | | | | |
| 29 | EDDHA (0.01) | isopropyl alcohol (0.01) | <9 | <6 |
| 30 | EDDHA (0.01) | phosphoric acid (0.01) | <9 | <6 |
| 31 | Tiron (0.01) | isopropyl alcohol (0.01) | 27 | <6 |
| 32 | Tiron (0.01) | catechol (0.01) | 27 | <6 |
| 33 | Tiron (0.01) | 1,4-dioxane (0.01) | 27 | <6 |
| 34 | Tiron (0.01) | potassium sulfate (0.01) | 27 | <6 |
| 35 | Tiron (0.01) | potassium nitrite (0.01) | 18 | <6 |
| 36 | Tiron (0.01) | phosphoric acid (0.01) | 25 | <6 |
| 37 | Tiron (0.01) | tripolyphosphoric acid (0.01) | 70 | <6 |
| 38 | Tiron (0.01) | perchloric acid (0.01) | 53 | <6 |
| 39 | Tiron (0.01) | potassium carbonate (0.01) | 53 | <6 |

EXAMPLES 40 TO 44 (COMBINATION USE OF A GROUP AND B4 GROUP) AND COMPARATIVE EXAMPLE 17

The same procedure as in Example 9 was repeated, except that complexing agents shown in the following Table 5 were used. The results are shown in the following Table 5.

TABLE 5

| Example No. | Metal deposition preventive (added amount/wt %) A Group | B2 Group | Metal deposit amount (×10¹⁰ atoms/cm²) Al | Fe |
|---|---|---|---|---|
| Example | | | | |
| 40 | EDDHA (0.01) | acetic acid (0.01) | <9 | <6 |
| 41 | Tiron (0.01) | acetic acid (0.01) | <9 | <6 |
| 42 | Tiron (0.01) | oxalic acid (0.01) | 27 | <6 |
| 43 | Tiron (0.01) | malonic acid (0.01) | 27 | <6 |
| 44 | Tiron (0.01) | oxalic acid (0.05) + TMAH (0.05) | <9 | <6 |
| Comparative Example 17 | Tiron (0.01) + TMAH (0.01) | | 71 | <6 |

EXAMPLES 45 TO 49 (COMBINATION USE OF A GROUP AND B5 GROUP) AND COMPARATIVE EXAMPLES 18 TO 19

The same procedure as in Example 9 was repeated, except that complexing agents shown in the following Table 6 were used. The results are shown in the following Table 6.

TABLE 6

| Example No. | Metal deposition preventive (added amount/wt %) | | Metal deposit amount (×10$^{10}$ atoms/cm$^2$) | |
|---|---|---|---|---|
| | A Group | B5 Group | Al | Fe |
| Example | | | | |
| 45 | EDDHA (0.01) | tartaric acid (0.01) | <9 | <6 |
| 46 | catechol (0.01) | tartaric acid (0.01) | 50 | <6 |
| 47 | Tiron (0.01) | tartaric acid (0.01) | 27 | <6 |
| 48 | Tiron (0.01) | salicylic acid (0.01) | 18 | <6 |
| 49 | Tiron (0.01) | sulfosalicyclic acid (0.01) | 27 | <6 |
| Comparative Example | | | | |
| 18 | | tartaric acid (0.1) | 910 | 190 |
| 19 | | catechol (0.01) + gluconic acid (0.01) | 270 | <6 |

EXAMPLES 50 TO 51 (COMBINATION USE OF A2 GROUP AND B6 GROUP)

The same procedure as in Example 9 was repeated, except that complexing agents shown in the following Table 7 were used. The results are shown in the following Table 7.

TABLE 7

| Example No. | Metal deposition preventive (added amount/wt %) | | Metal deposit amount (×10$^{10}$ atoms/cm$^2$) | |
|---|---|---|---|---|
| | A2 Group | B6 Group | Al | Fe |
| 50 | EDDHA (0.01) | acetylacetone (0.01) | <9 | <6 |
| 51 | Tiron (0.01) | acetylacetone (0.01) | <9 | <6 |

EXAMPLES 52 TO 57 AND COMPARATIVE EXAMPLES 20 TO 24

100 ppm of EDDHA was added as a metal deposition preventive to a mixture of aqueous ammonia (30 wt %), hydrogen peroxide (31 wt %) and water in a volume ratio of X:Y:Z to form an aqueous solvent containing the above obtained mixture solution as the main component, the temperature of which was raised and maintained at 40–50° C. to prepare a surface treatment composition.

The surface treatment solution thus prepared was allowed to stand for a predetermined time, and 1 ppb of each of Al and Fe (by using chlorides) was added therein and a clean silicon wafer (p type, CZ, plane orientation (100)) was dipped for 10 minutes. The dipped wafer was overflow-rinsed with ultra-pure water for 10 minutes and was dried by nitrogen blow to determine Al and Fe deposited on the wafer surface. Al and Fe deposited on the silicon wafer were recovered with a mixture solution of 0.1 wt % of hydrofluoric acid and 1 wt % of hydrogen peroxide, and the metal amounts were measured by flameless atomic absorption spectrometry and were converted into a substrate surface concentration (atoms/cm$^2$). The results are shown in the following Table 8.

TABLE 8

| | Volume ratio (values in parentheses () indicate wt %) | | | Time allowed to stand (min) | Metal deposit amount (×10$^{10}$ atoms/cm$^2$) | |
|---|---|---|---|---|---|---|
| | NH$_4$OH X | H$_2$O$_2$ Y | H$_2$O Z | | Al | Fe |
| Example 52 | 0.5(1.2) | 1.0(2.5) | 11 | 120 | 42 | <6 |
| Example 53 | 0.5(1.2) | 0.1(0.25) | 11.9 | 120 | 32 | <6 |
| Example 54 | 0.2(0.05) | 1.0(2.7) | 10 | 120 | 24 | <6 |
| Example 55 | 1.0(2.5) | 1.0(2.6) | 10 | 120 | 53 | <6 |
| Example 56 | 0.5(1.3) | 1.0(2.7) | 10 | 120 | 38 | <6 |
| Example 57 | 0.1(0.3) | 0.2(0.5) | 10 | 120 | 12 | <6 |
| Comparative Example 20 | 0.5(1.2) | 2.0(5.0) | 10 | 0 | 27 | <6 |
| Comparative Example 21 | 0.5(1.2) | 2.0(5.0) | 10 | 120 | 180 | <6 |
| Comparative Example 22 | 0.5(1.2) | 2.0(5.0) | 10 | 240 | 580 | 52 |
| Comparative Example 23 | 0.5(1.2) | 12(30) | 0 | 120 | 850 | 70 |
| Comparative Example 24 | 2.0(4.3) | 2.0(4.4) | 10 | 120 | 690 | 43 |

As shown in Table 8, when an oxidizing agent concentration is at most 3 wt %, a metal deposition preventive effect on a metal surface is maintained even after allowing to stand for a long time.

EXAMPLE 58

The same procedure as in Example 57 was repeated, except that the temperature was maintained at 70° C. After allowing to stand for 2 hours, a metal deposition amount on a substrate was Al=18, Fe<6 atoms/cm$^2$. Thus, a metal deposition preventive performance was maintained.

EXAMPLES 59 TO 60 AND COMPARATIVE EXAMPLES 25 TO 26

1,000 ppm of Tiron was added as a metal deposition preventive to a mixture of aqueous ammonia (30 wt %), hydrogen peroxide (31 wt %) and water in a volume ratio of X:Y:Z to form an aqueous solvent containing the above obtained mixture solution as the main component, the temperature of which was maintained at 40–50° C. to prepare a surface treatment composition.

After allowing the above prepared surface treatment solution to stand for a predetermined time, 1 ppb of each of Al and Fe (by using chlorides) was added thereto and a clean silicon wafer (p type, CZ, plane orientation (100)) was dipped therein for 10 minutes. The dipped wafer was overflow-rinsed with pure water for 10 minutes, and was then dried by nitrogen blow to determine Al and Fe deposited on the wafer surface. Al and Fe deposited on the silicon wafer were recovered by a mixture solution of 0.1 wt % of hydrofluoric acid and 1 wt % of hydrogen peroxide, and the metal amounts were measured by flameless atomic absorption spectrometry, and were converted into a substrate surface concentration (atoms/cm$^2$). The results are shown in the following Table 9.

TABLE 9

| | Volume ratio (values in parentheses () indicate wt %) | | | Time allowed to stand (min) | Metal deposit amount (×10¹⁰ atoms/cm²) | |
|---|---|---|---|---|---|---|
| | NH₄OH X | H₂O₂ Y | H₂O Z | | Al | Fe |
| Example 59 | 0.2(0.05) | 1.0(2.7) | 10 | 0 | 70 | <6 |
| Example 60 | 0.2(0.05) | 1.0(2.7) | 10 | 120 | 80 | <6 |
| Comparative Example 25 | 0.5(1.2) | 2.0(5.0) | 10 | 0 | 84 | <6 |
| Comparative Example 26 | 0.5(1.2) | 2.0(5.0) | 10 | 120 | 520 | <6 |

As shown in Table 9, even if EDDHA as an organic complexing agent was replaced by Tiron, when an oxidizing agent concentration was at most 3 wt %, a metal deposition preventive effect on a substrate surface was maintained even after allowing to stand for a long time.

EXAMPLE 61 TO 62 AND COMPARATIVE EXAMPLES 27 TO 28

10 ppm of EDDHA and 10 ppm of o-phenanthroline were added as metal deposition preventives to a mixture of aqueous ammonia (30 wt %), hydrogen peroxide (31 wt %) and water in a volume ratio of X:Y:Z to form an aqueous solvent containing the above mixture solution as the main component, the temperature of which was maintained at 40–50° C. to prepare a surface treatment composition.

After allowing the above prepared surface treatment solution to stand for a predetermined time, 1 ppb of each of Al and Fe (by using chlorides) was added thereto, and a clean silicon wafer (p type, CZ, plane orientation (100)) was dipped therein for 10 minutes. The dipped wafer was overflow-rinsed with ultra-pure water for 10 minutes and was then dried by nitrogen blow to determine Al and Fe deposited on the wafer surface. Al and Fe deposited on the silicon wafer were recovered by a mixture solution of 0.1 wt % of hydrofluoric acid and 1 wt % of hydrogen peroxide, and the metal amounts were measured by flameless atomic absorption spectrometry and were converted into a substrate surface concentration (atoms/cm²). The results are shown in the following Table 10.

TABLE 10

| | Volume ratio (values in parentheses () indicate wt %) | | | Time allowed to stand (min) | Metal deposit amount (×10¹⁰ atoms/cm²) | |
|---|---|---|---|---|---|---|
| | NH₄OH X | H₂O₂ Y | H₂O Z | | Al | Fe |
| Example 61 | 0.2 (0.05) | 1.0(2.7) | 10 | 0 | <9 | <6 |
| Example 62 | 0.2 (0.05) | 1.0(2.7) | 10 | 120 | <9 | <6 |
| Comparative Example 27 | 0.5(1.2) | 2.0(5.0) | 10 | 0 | <9 | <6 |
| Comparative Example 28 | 0.5(1.2) | 2.0(5.0) | 10 | 120 | 220 | <6 |

EXAMPLES 63 TO 64 AND COMPARATIVE EXAMPLE 29

An aqueous ammonia (30 wt %), hydrogen peroxide (31 wt %) and water were mixed in a ratio of 1:1:10, and the mixture solution thus obtained was used as the main component for forming an aqueous solvent. To the aqueous solvent, was added a predetermined amount of each of complexing agents of the present invention shown in the following Table 11 as a metal deposition preventive to prepare a surface treatment composition of the present invention. Comparative Example was prepared by adding no complexing agent to the aqueous solvent.

A silicon wafer (p type, CZ, plane orientation (100)), the surface of which was contaminated with a metal, was dipped in the above prepared surface treatment solution for 10 minutes to clean the metal contamination. During dipping, a liquid temperature of the surface treatment solution was raised and maintained at 40–50° C. After dipping, the silicon wafer was overflow-rinsed with ultra-pure water for 10 minutes, and was then dried by nitrogen blow to determine a metal on the wafer surface. The metal on the silicon wafer surface was recovered with a mixture solution of 0.1 wt % of hydrofluoric acid and 1 wt % of hydrogen peroxide, and the metal amount was measured by flameless atomic absorption spectrometry and was converted into a substrate surface concentration (atoms/cm²). The results are shown in the following Table 11.

TABLE 11

| | Metal deposition preventive (added amount/wt %) | | Metal deposit amount (× 10¹⁰ atoms/cm²) | | |
|---|---|---|---|---|---|
| Example No. | A Group | B Group | Al | Fe | Ca |
| Before washing | — | | 3500 | 1100 | 350 |
| Example 63 | EDDHA (0.01) | o-phen-anthroline (0.005) | <9 | <6 | <4 |
| Example 64 | EDDHA (0.01) | acetic acid (0.05) | <9 | <6 | <4 |
| Comparative Example 29 | none | | 790 | 990 | 120 |

As shown in Table 11, when the substrate is treated with the surface treatment solution of the present invention, metal deposition from the solution onto the substrate surface can be prevented, and metal contamination can be removed when the substrate surface is contaminated with a metal.

EXAMPLE 65 AND COMPARATIVE EXAMPLES 30 TO 32

Aqueous ammonia (30 wt %), hydrogen peroxide (31 wt %) and water were mixed in a volume ratio of 1:1:10, and to the aqueous solvent thus obtained, was added a predetermined amount of a complexing agent shown in the following Table 12 as a metal deposition preventive to prepare a surface treatment composition of the present invention. The amount of the complexing agent added was expressed by a weight ratio (ppm) to the aqueous solvent. Comparative Example was made without adding a complexing agent. The total volume of the surface treatment composition was 2.8 l and was placed in a quartz tank with no lid having a capacity of 6 l. A temperature of the solution was raised and maintained at 40–50° C.

The surface treatment solution thus prepared was allowed to stand at 40–50° C. for such a predetermined time as shown in the following Table 12. When allowing to stand, the ammonia content evaporated was supplied with aqueous ammonia (30 wt %) containing a predetermined amount of a complexing agent shown in the following Table 12. The amount of the complexing agent added in this case was expressed by a weight ratio (ppm) to the ammonia aqueous solution. The amount of the ammonia aqueous solution supplied was 76 ml per hour. After allowing to stand for a predetermined time, 1 ppb of each of Al and Fe was added thereto and a clean silicon wafer (p type, CZ, plane orientation (100)) was dipped therein for 10 minutes. After dipping, the wafer was overflow-rinsed with ultra-pure water for 10 minutes, and was then dried by nitrogen blow to determine Al and Fe deposited on the wafer surface. Al and Fe deposited on the silicon wafer were recovered with a mixture solution of 0.1 wt % of hydrofluoric acid and 1 wt % of hydrogen peroxide, and metal amounts were measured by flameless atomic absorption spectrometry and were converted into substrate surface concentrations (atoms/cm$^2$). The results are shown in the following Table 12. Further, for comparison, experimental results in cases of not allowing surface treatment solutions to stand (case of adding no complexing agent: Comparative Example 30, case of adding a complexing agent: Comparative Example 31), and experimental results in case of allowing a surface treatment solution to stand for 4 hours, during which evaporated ammonia content was supplied with aqueous ammonia containing no complexing agent (Comparative Example 32), are shown in the following Table 12.

surface can be maintained even after allowing the surface treatment solution to stand for a long time.

EXAMPLES 66 TO 67 AND COMPARATIVE EXAMPLES 33 TO 34

Aqueous ammonia (30 wt %), hydrogen peroxide (31 wt %) and water were mixed in a volume ratio of 1:1:10, and to the aqueous solvent thus obtained, were added predetermined amounts of two complexing agents shown in the following Table 13 as metal deposition preventives to prepare a surface treatment composition of the present invention. This solution was maintained at 40–50° C. and was allowed to stand for 4 hours. Thereafter, metal deposition properties on a substrate surface were evaluated in the same manner as in Example 65. When allowing to stand, an evaporated ammonia content was supplied with aqueous ammonia (30 wt %) containing predetermined amounts of two complexing agents shown in Table 13. For comparison, results in case of supplying an evaporated ammonia content

TABLE 12

| | Complexing agent (added amount/ppm) | | Time allowed to stand (hr) | Metal deposit amount ($\times 10^{10}$ atoms/cm$^2$) | |
|---|---|---|---|---|---|
| | in initial surface treatment composition | in aqueous ammonia supplied | | Al | Fe |
| Example 65 | EDDHA (100) | EDDHA (1200) | 4 | 18 | <6 |
| Comparative Example 30 | none | no supplied | 0 | 340 | 75 |
| Comparative Example 31 | EDDHA (100) | no supplied | 0 | 18 | <6 |
| Comparative Example 32 | EDDHA (100) | Supplied aqueous ammonia containing no additive | 4 | 310 | 250 |

As shown in Table 12, when evaporated ammonia content is supplied with aqueous ammonia containing 1,200 ppm of EDDHA, a metal deposition preventive effect on a substrate with aqueous ammonia containing no complexing agent are shown also in the following Table 13. All other experiment conditions were the same as those in Example 65.

TABLE 13

| | | Complexing agent (added amount/ppm) | | Time allowed to stand (hr) | Metal deposit amount ($\times 10^{10}$ atoms/cm$^2$) | |
|---|---|---|---|---|---|---|
| | | in initial surface treatment composition | in aqueous ammonia supplied | | Al | Fe |
| Example 66 | | EDDHA (20) o-phenanthroline (10) | EDDHA (240) o-phenanthroline (120) | 4 | <9 | <6 |
| Example 67 | | EDDHA (20) acetic acid (10) | EDDHA (240) acetic acid (120) | 4 | <9 | <6 |
| Comparative Example 33 | | EDDHA (20) o-phenanthroline (10) | Supplied aqueous ammonia containing no additive | 4 | 310 | 230 |
| Comparative Example 34 | | EDDHA (20) acetic acid (10) | Supplied aqueous ammonia containing no additive | 4 | 380 | 180 |

EXAMPLES 68 TO 71 AND COMPARATIVE EXAMPLES 35 TO 37

Aqueous ammonia (30 wt %), hydrogen peroxide (31 wt %) and water were mixed in a volume ratio of 1:2:100, and to the aqueous solvent thus obtained, were added predetermined amounts of two complexing agents shown in the following Table 14 as a metal deposition preventive or metal-removing agent to prepare a surface treatment composition of the present invention. This solution was maintained at 35–45° C., and after allowing the surface treatment composition to stand for 4 hours or 8 hours, metal deposition properties on a substrate surface were evaluated in the same manner as in Example 65. During allowing to stand, an evaporated ammonia content was supplied with aqueous ammonia (30 wt %) containing predetermined amounts of two complexing agents shown in the following Table 14. The amount of the ammonia aqueous solution supplied was 17 ml per hour. For comparison, experimental results in case of supplying an evaporated ammonia content with aqueous ammonia containing no complexing agent are shown in the following Table 14. All other experimental conditions were the same as those in Example 65.

TABLE 14

| | Complexing agent (added amount/ppm) | | Time allowed to stand (hr) | Metal deposit amount ($\times 10^{10}$ atoms/cm$^2$) | |
|---|---|---|---|---|---|
| | in initial surface treatment composition | in aqueous ammonia supplied | | Al | Fe |
| Example 68 | EDDHA (2) o-phenanthroline (1) | EDDHA (200) o-phenanthroline (100) | 4 | <9 | <6 |
| Example 69 | EDDHA (2) o-phenanthroline (1) | EDDHA (200) o-phenanthroline (100) | 8 | <9 | <6 |
| Example 70 | EDDHA (2) acetic acid (1) | EDDHA (200) acetic acid (100) | 4 | <9 | <6 |
| Example 71 | Tiron (50) o-phenanthroline (5) | Tiron (5000) o-phenanthroline (500) | 4 | <9 | <6 |
| Comparative Example 35 | EDDHA (2) o-phenanthroline (1) | Supplied aqueous ammonia containing no additive | 4 | 76 | 18 |
| Comparative Example 36 | EDDHA (2) acetic acid (1) | Supplied aqueous ammonia containing no additive | 4 | 90 | 25 |
| Comparative Example 37 | Tiron (50) o-phenanthroline (5) | Supplied aqueous ammonia containing no additive | 4 | 120 | 45 |

EXAMPLE 72 AND COMPARATIVE EXAMPLE 38

Aqueous ammonia (30 wt %), hydrogen peroxide (31 wt %) and water were mixed in a volume ratio of 1:2:100, and to the aqueous solvent thus obtained, were added predetermined amounts of two complexing agents shown in the following Table 15 as a metal deposition preventive or metal-removing agent to prepare a surface treatment composition of the present invention. This solution was maintained at 60–70° C., and after allowing the solution to stand for 4 hours, metal deposition properties on a substrate surface were evaluated in the same manner as in Example 63. During allowing to stand, an evaluated ammonia content was supplied with aqueous ammonia (30 wt %) containing predetermined amounts of two complexing agents shown in the following Table 15. The amount of the aqueous ammonia supplied was 32 ml per hour. For comparison, experimental results in case of supplying an evaporated ammonia content with aqueous ammonia containing no complexing agent are shown in the following Table 15. All other experimental conditions were the same as those in Example 65.

TABLE 15

| | Complexing agent (added amount/ppm) | | Time allowed to stand (hr) | Metal deposit amount ($\times 10^{10}$ atoms/cm$^2$) | |
|---|---|---|---|---|---|
| | in initial surface treatment composition | in aqueous ammonia supplied | | Al | Fe |
| Example 72 | EDDHA (2) o-phenanthroline (1) | EDDHA (200) o-phenanthroline (100) | 4 | <9 | <6 |
| Comparative Example 38 | EDDHA (2) o-phenanthroline (1) | Supplied aqueous ammonia containing no additive | 4 | 180 | 92 |

EXAMPLE 73 AND COMPARATIVE EXAMPLES 39 TO 40

7 wt % of nitric acid aqueous solution was added to commercially available EDDHA (CATALOG #: E4135, Lot No. 85H5041 manufactured by SIGMA CHEMICAL COMPANY, USA) in an amount of 10 ml per g of EDDHA to solve EDDHA. The EDDHA nitric acid aqueous solution was filtrated by a Teflon filter (PTFE made) having an opening diameter of 0.1 µm to remove insoluble impurities. To the filtrate thus obtained, was added 6 wt % of ammonia aqueous solution until a pH value of the solution becomes 8, thereby precipitating a crystal of EDDHA. The EDDHA crystal was obtained by filtrating with a filter having an opening diameter of 5 µm. Further, the crystal thus obtained was washed with pure water on the filter.

The above operation was repeated 8 times, and the EDDHA crystal thus purified was dried in a drier to obtain a highly pure EDDHA of the present invention.

A metal impurity amount in the EDDHA was analyzed after being wet-decomposed in the following manner. 1 g of EDDHA was placed in a clean quartz flask, and was subjected to carbonization by heat after adding 5 ml of sulfuric acid. Thereafter, nitric acid and aqueous hydrogen peroxide were added thereto, and the resultant EDDHA was subjected to oxydation-decomposition while heating. The resultant EDDHA was further heated to evaporate materials other than sulfuric acid, and was adjusted to 50 ml with pure water. In this manner, the sample was wet-decomposed, and the metal impurity amount was analyzed by ICP-AES method and atomic absorption spectrometry.

Analytical values of the highly pure EDDHA obtained in the above operation are shown in the following Table 16. Also, for comparison, analytical values of unpurified EDDRA (Lot NO. 85H5041: Comparative Example 39, Lot No. 117F50221: Comparative Example 40, manufactured by SIGMA CHEMICAL COMPANY, USA) are shown in the following Table 16.

TABLE 16

| Element | Unit | Highly pure product Comparative Example 73 | Conventional product (unpurified product) Comparative Example 39 | Comparative Example 40 |
|---|---|---|---|---|
| Al | ppm | <5 | 11 | 6 |
| Cr | ppm | <1 | 50 | 4.5 |
| Cu | ppm | <1 | 4 | 4 |
| Fe | ppm | <1 | 950 | 210 |
| Mn | ppm | <0.25 | 60 | 4 |
| Na | ppm | <0.5 | 1500 | 120 |
| Ni | ppm | <2.5 | 80 | 4 |
| Zn | ppm | <1 | 7.5 | 19 |

As shown in Table 16, conventionally commercially available EDDHA contains metal impurities respectively in an amount of several to several thousands ppm, but the metal impurities can be reduced to at most 5 ppm by the purification method of the present invention.

EXAMPLE 74

To commercially available EDDHA (CATALOG #: E4135, Lot No. 117F50221: Comparative Example 40, manufactured by SIGMA CHEMICAL COMPANY, USA), was added 3 wt % of ammonia aqueous solution in an amount of 10 ml per g of EDDHA to dissolve EDDHA. This EDDHA nitric acid aqueous solution was filtrated by a Teflon filter (PTFE made) having an opening diameter of 0.1 μm to remove insoluble impurities. To the filtrate thus obtained, was added 23 wt % of nitric acid aqueous solution until a pH value of the solution becomes 6, thereby precipitating EDDHA crystal. The EDDHA crystal was obtained by filtrating with a Teflon filter (PTFE made) having an opening diameter of 5 μm. Further, the crystal thus obtained was washed with pure water on the filter.

The above operation was repeated 7 times, and the purified EDDHA crystal was dried in a drier to obtain highly pure EDDHA of the present invention. The highly pure EDDHA of the present invention was analyzed in the same manner as in Example 73, and the results are shown in the following Table 17.

TABLE 17

| Element | Unit | Highly pure product Example 74 |
|---|---|---|
| Al | ppm | <5 |
| Cr | ppm | <1 |
| Cu | ppm | <1 |
| Fe | ppm | <1 |
| Mn | ppm | <0.25 |
| Na | ppm | <0.5 |
| Ni | ppm | <2.5 |
| Zn | ppm | <1 |

EXAMPLE 75

240 ppm of the highly pure EDDHA obtained in Example 74 was added and dissolved in a highly pure ammonia aqueous solution (30 wt %) to obtain EDDHA-added ammonia aqueous solution of the present invention. Analytical results of metal impurities in the EDDHA-added ammonia aqueous solution thus obtained are shown in the following Table 18.

TABLE 18

| Element | Unit | Example 75 |
|---|---|---|
| Al | ppb | <1 |
| Cr | ppb | <0.5 |
| Cu | ppb | <0.5 |
| Fe | ppb | <0.5 |
| Mn | ppb | <0.5 |
| Na | ppb | <0.5 |
| Ni | ppb | <0.5 |
| Zn | ppb | <0.5 |

As shown in Table 18, each of metal element contents can be reduced to at most 1 ppb by using the highly pure EDDHA of the present invention (in case that an amount of EDDHA added is 240 ppm).

EXAMPLES 76 TO 77 AND COMPARATIVE EXAMPLES 41 TO 44

Aqueous ammonia (30 wt %), hydrogen peroxide (31 wt %) and water were mixed in a volume ratio of 1:1:10, and to the aqueous solvent thus obtained, was added a predetermined amount of EDDHA shown in the following Table 19 to prepare a surface treatment composition of the present invention. The highly pure EDDHA obtained in Example 71 was used as EDDHA. Also, for comparison, conventionally commercially available EDDHA (CATALOG #: E4135, Lot No. 117F50221: the same as used in Comparative Example 40, manufactured by SIGMA CHEMICAL COMPANY, USA) was used as it is for Comparative Examples. Amounts of EDDHA added were expressed by weight ratio (ppm) to the aqueous solvent. Further, for comparison, a comparative composition containing no EDDHA in the aqueous solvent was prepared. The total volume amount of a surface treatment composition was 2.8 l, and the composition was placed in a quartz tank with no lid having a capacity of 6 l. A temperature of the liquid was raised and maintained at 55–65° C.

The surface treatment solution thus prepared was allowed to stand at 55–65° C. for a predetermined time. After allowing to stand for a predetermined time, 1 ppb of each of Al and Fe was added thereto, and a clean silicon wafer (p type, CZ, plane orientation (100)) was dipped therein for 10 minutes. After dipping, the wafer was overflow-rinsed with ultra-pure water for 10 minutes, and was then dried by nitrogen blow to determine Al and Fe deposited on the wafer surface. Al and Fe deposited on the silicon wafer were recovered by a mixture solution of 0.1 wt % of hydrofluoric acid and 1 wt % of hydrogen peroxide, and the metal amounts were measured by flameless atomic absorption spectrometry and were converted into substrate surface concentrations (atoms/cm$^2$). The results are shown in the following Table 19. Further, for comparison, experimental results in cases of not allowing surface treatment solutions to stand are shown in the following Table 19.

TABLE 19

| | Complexing agent | Time allowed to stand | Metal deposit amount (× 10$^{10}$ atoms/cm$^2$) | |
|---|---|---|---|---|
| | (added amount/ppm) | (hr) | Al | Fe |
| Example 76 | highly pure EDDHA (100) | 0 | 25 | <6 |
| Example 77 | highly pure EDDHA (100) | 2 | 50 | <6 |
| Comparative Example 41 | conventional EDDHA (100) | 0 | 25 | <6 |
| Comparative Example 42 | conventional EDDHA (100) | 2 | 380 | 450 |
| Comparative Example 43 | none | 0 | 340 | 85 |
| Comparative Example 44 | none | 2 | 350 | 80 |

As shown in Table 19, when the highly pure EDDHA was used, a metal deposition preventive effect on a substrate surface was maintained even after a surface treatment solution was allowed to stand at 60° C. for a long time. On the other hand, when conventional EDDHA was used, a deposition preventive effect could be recognized immediately after addition, but the effect was lowered while using for a long time. Particularly, a deposition amount of Fe was more increased than in the case of using no complexing agent. This is probably because a large amount of Fe contained in the conventional EDDHA was separated from EDDHA at the decomposition of EDDHA and was deposited on the substrate surface.

EXAMPLES 78 TO 80 AND COMPARATIVE EXAMPLES 45 TO 46

Aqueous ammonia (30 wt %), hydrogen peroxide (31 wt %) and water were mixed in a volume ratio of 1:1:10, and to the aqueous solvent thus obtained, was added predetermined amounts of two complexing agents shown in the following Table 20 as metal deposition preventives to prepare a surface treatment composition of the present invention. The highly pure EDDHA obtained in Example 73 was used as EDDHA. For comparison, conventional EDDHA (CATALOG #: E4135, Lot No. 117F50221: the same as used in Comparative Example 40, manufactured by SIGMA CHEMICAL COMPANY, USA) was used for Comparative Examples. An amount of each metal element in acetic acid and o-phenanthroline was at most 1 ppm. This solution was allowed to stand at 55–65° C. for a predetermined time, and metal deposition properties on a substrate surface were evaluated in the same manner as in Example 73. All other experimental conditions were the same as those of Example 76. Experimental results are shown in the following Table 20.

TABLE 20

| | Complexing agent | Time allowed to stand | Metal deposit amount (×10$^{10}$ atoms/cm$^2$) | |
|---|---|---|---|---|
| | (added amount/ppm) | (hr) | Al | Fe |
| Example 78 | highly pure EDDHA (20) acetic acid (100) | 0 | <9 | <6 |
| Example 79 | highly pure EDDHA (20) acetic acid (100) | 2 | 32 | <6 |
| Example 80 | highly pure EDDHA (20) o-phenanthroline (10) | 2 | 40 | <6 |
| Comparative Example 45 | conventional EDDHA (20) acetic acid (100) | 0 | <9 | <6 |
| Comparative Example 46 | conventional EDDHA (20) acetic acid (100) | 2 | 329 | 227 |

Industrial Applicability

The surface treatment composition of the present invention containing a specific complexing agent as a metal deposition preventive, prevents a substrate surface from being contaminated with metal impurities such as Al and Fe from the surface treatment composition, and stably provides an extremely clean substrate surface.

Particularly, when the present invention is applied to alkali cleaning of a semiconductor substrate represented by "ammonia+hydrogen peroxide+water" cleaning, a conventional problem of this cleaning method concerning a metal impurity deposition problem is solved, and a highly clean substrate surface can be provided by this cleaning without being contaminated with particles, organic materials and metals. Thus, conventionally employed acid cleaning such as "hydrochloric acid+hydrogen peroxide+water" cleaning conducted after this cleaning can be omitted, and it is therefore possible to largely reduce the cleaning cost, a clean room cost including an exhauster equipment and the like, thus being largely advantageous in industrial production of semiconductor integrated circuits.

What is claimed is:

1. A method for treating the surface of a substrate with a surface treatment composition, wherein the surface treatment composition is a composition containing an oxidizing agent and an organic complexing agent having an OH group bonded directly to an aromatic hydrocarbon group, and which organic complexing agent is a phenol derivative of an alkylamine, in an alkaline liquid medium containing at most 3 wt % of ammonia, and the concentration of the oxidizing agent is from 1 ppm to 3 wt %.

2. The method according to claim 1, wherein the organic complexing agent is a complexing agent is a complexing agent having at least 2 OH groups bonded directly to an aromatic hydrocarbon group in one molecule.

3. The method according to claim 1, wherein the liquid medium contains at least 2 complexing agents and at least one of the complexing agents is a complexing agent not having an OH group bonded directly to an aromatic hydrocarbon group in a molecule.

4. The method according to claim 3, wherein the complexing agent not having an OH group bounded directly to an aromatic hydrocarbon group is a complexing agent selected from the group consisting of the following Groups B1 to B6 complexing agents:

Group B1: complexing agents having at least one nitrogen atom as a donor atom in the molecular structure thereof;

Group B2: complexing agents having at least one atom selected from halogen, sulfur and carbon atoms as a donor atom in the molecular structure thereof;

Group B3: complexing agents having at least one oxygen atom as a donor atom in the molecular structure thereof, but not having a carbonyl group and a carboxyl group and not having any one of nitrogen, halogen, sulfur and carbon atoms as a donor atom;

Group B4: carboxylic acid type complexing agents having at least one carboxyl group in the molecular structure thereof, but not having any one of nitrogen, halogen, sulfur and carbon atoms as a donor atom and not having a carbonyl group and a hydroxyl group;

Group B5: hydroxymono- or di-carboxylic acid type complexing agents having a most 4 hydroxyl groups in the molecular structure thereof, but not having any one of nitrogen, halogen, sulfur and carbon atoms as a donor atom and not having a carbonyl group; and Group B6: complexing agents having at least one carbonyl group in the molecular structure thereof.

5. The method according to claim 1, wherein the oxidizing agent is from 100 ppm by weight to 3% by weight of hydrogen peroxide.

6. A surface treatment composition containing an oxidizing agent and an organic complexing agent having an OH group bonded directly to an aromatic hydrocarbon group, and which organic complexing agent is a phenol derivative of an alkylamine, in an alkaline liquid medium containing at most 3 wt % of ammonia, wherein the concentration of the oxidizing agent is from 1 ppm by weight to 3% by weight.

7. A composition consisting essentially of (1) a liquid medium, (2) a complexing agent comprising at least one complexing agent selected from the group consisting of diammonium 4,4'-bis(3,4-dihydroxyphenylazo)-2,2'-stilbenedisulfonate, Pyrocatechol Violet, o,o'-dihydroxyazobenze, and N,N'-bis(2-hydroxybenzyl)ethylenediamine-N,N'-diacetic acid, as a metal deposition preventive in the liquid medium, (3) optionally an oxidizing agent, and (4) optionally a surfactant.

8. The method according to claim 1, wherein the phenol derivative of an alkylamine is EDDHA.

9. The surface treatment composition according to claim 6, wherein the phenol derivative of an alkylamine is EDDHA.

10. The composition according to claim 7, wherein the phenol derivative of an alkylamine is EDDHA.

* * * * *